United States Patent
Dornberger et al.

(10) Patent No.: US 11,340,322 B2
(45) Date of Patent: May 24, 2022

(54) LOCAL COIL WITH INTEGRATED PILOT TONE TRANSMITTER

(71) Applicant: Siemens Healthcare GmbH, Erlangen (DE)

(72) Inventors: Barbara Dornberger, Erlangen (DE); Robert Rehner, Neunkirchen am Brand (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/677,636

(22) Filed: Nov. 7, 2019

(65) Prior Publication Data

US 2020/0150201 A1 May 14, 2020

(30) Foreign Application Priority Data

Nov. 8, 2018 (EP) ..................... 18205132

(51) Int. Cl.
| | | |
|---|---|---|
| *G01R 33/36* | (2006.01) | |
| *G01R 33/341* | (2006.01) | |
| *H01Q 1/24* | (2006.01) | |
| *H01Q 7/00* | (2006.01) | |

(52) U.S. Cl.
CPC ....... *G01R 33/3642* (2013.01); *G01R 33/341* (2013.01); *H01Q 1/24* (2013.01); *H01Q 7/00* (2013.01)

(58) Field of Classification Search
USPC ....................................................... 324/322
See application file for complete search history.

(56) References Cited

U.S. PATENT DOCUMENTS

| | | | |
|---|---|---|---|
| 5,294,886 A | | 3/1994 | Duerr |
| 10,393,845 B2* | | 8/2019 | Schroter ............ G01R 33/3692 |
| 2008/0231278 A1 | | 9/2008 | Ishihara et al. |
| 2010/0259261 A1* | | 10/2010 | Saes ................... G01R 33/341 |
| | | | 324/309 |
| 2013/0207660 A1 | | 8/2013 | Lips |
| 2014/0239953 A1 | | 8/2014 | Luong |
| 2015/0346295 A1 | | 12/2015 | Reykowski |
| 2016/0245888 A1 | | 8/2016 | Bollenbeck |
| 2017/0160367 A1* | | 6/2017 | Schroter ............ G01R 33/3607 |
| 2017/0176552 A1 | | 6/2017 | Reykowski |
| 2020/0166597 A1* | | 5/2020 | Speier ............... G01R 33/5673 |

(Continued)

FOREIGN PATENT DOCUMENTS

| | | |
|---|---|---|
| CN | 102288930 A | 12/2011 |
| CN | 202189138 U | 4/2012 |

(Continued)

OTHER PUBLICATIONS

Google Translation of European Search Report for Application No. 18205132.6-1022, filed May 28, 2019 (Year: 2019).*

(Continued)

*Primary Examiner* — Rodney E Fuller
(74) *Attorney, Agent, or Firm* — Lempia Summerfield Katz LLC

(57) ABSTRACT

A local coil for a magnetic resonance tomograph includes a transmitting antenna for emitting a pilot tone, and a receiving antenna for receiving the pilot tone. The local coil also has a decoupling device for decoupling the receiving antenna from the transmitting antenna.

14 Claims, 3 Drawing Sheets

(56) References Cited

U.S. PATENT DOCUMENTS

2020/0367765 A1* 11/2020 Bacher ................. A61B 5/0263
2020/0396112 A1* 12/2020 Biber ................. G01R 33/3607

FOREIGN PATENT DOCUMENTS

| DE | 102015203385 A1 | 8/2016 |
| DE | 102015224158 A1 | 6/2017 |
| EP | 2447732 A1 | 5/2012 |
| WO | WO2014096997 A1 | 6/2014 |
| WO | WO2015150953 A1 | 10/2015 |

OTHER PUBLICATIONS

European Search Report for corresponding Application No. 18205132.6-1022 filed May 28, 2019.
Pisa, Stefano, Erika Pittella, and Emanuele Piuzzi. "A survey of radar systems for medical applications." IEEE Aerospace and Electronic Systems Magazine 31.11 (2016): 64-81.
Schroeder, L., et al. "Two-dimensional respiratory-motion characterization for continuous MR measurements using pilot tone navigation." Proceedings of the 24th Annual Meeting of ISMRM, Singapore. 2016.
Schroeder, Lea, et al. "A novel method for contact-free cardiac synchronization using the pilot tone navigator." 24th ISMRM Annual Meeting and Exhibition. 2016.
Thiel, F., D. Kreiseler, and F. Seifert. "Non-contact detection of myocardium's mechanical activity by ultrawideband RF-radar and interpretation applying electrocardiography." Review of Scientific Instruments 80.11 (2009): 114302.
Chinese Office Action for Chinese Application No. 201911080055.7 dated Oct. 15, 2021, with English translation.

* cited by examiner

LOCAL COIL WITH INTEGRATED PILOT TONE TRANSMITTER

This application claims the benefit of EP 18205132.6, filed on Nov. 8, 2018, which is hereby incorporated by reference in its entirety.

BACKGROUND

The present embodiments relate to a local coil for a magnetic resonance tomograph.

Magnetic resonance tomographs are imaging devices that, for the representation of an examination object, orient nuclear spins of the examination object using a strong external magnetic field and via an alternating magnetic field excite the nuclear spins to precession around this orientation. The precession or return of the spins from this excited state to a state with lower energy generates in response an alternating magnetic field that is received via antennas.

With the aid of magnetic gradient fields, a spatial encoding is impressed on the signals, and this subsequently enables an allocation of the received signal to a volume element. The received signal is then evaluated, and a three-dimensional imaging representation of the examination object is provided.

Image acquisition in magnetic resonance tomography requires several milliseconds up to multiple seconds imaging, depending on the pulse sequence (e.g., a sequence) used, with a longer acquisition time conventionally leading to low noise artifacts. Image acquisition may thus be started at the beginning of a phase in which the body remains relatively unmoved in order to avoid movement artifacts due to a movement during image acquisition. Movements that are unavoidable are, for example, breathing and the heartbeat. However, a phase of relative calm follows a phase with movements (e.g., after expiration or contraction of the heart muscle). Image acquisition in this phase has a relatively long period of time with few anticipated movements, so the best measuring results are to be expected here.

In principle, it is already known to detect the movements, for example, by mechanical sensors or by electrodes, which measure the excitation potentials of the muscles.

Document DE 10 2015 203 385 describes a basic method of detecting the movements using a radio frequency signal. The signal is permanently detected in a patient scan of a magnetic resonance tomograph, and signal changes due to movements (e.g., due to changing interferences or damping) are evaluated. A movement of the patient, caused by breathing or heartbeat, may then be identified from particular patterns of this signal.

From document WO 2015/150953 A1, a transmitter for emitting a synchronization signal, which includes two antennas that are arranged at ends of a patient feed-through, is known. A pilot tone may also be emitted as the synchronization signal here.

Document DE 10 2015 224 158 describes a transmitter for pilot tone navigation in a magnetic resonance tomograph, as well as a method for detecting a movement of a patient. The transmitter has an energy supply and an antenna. The transmitter is configured to send a pilot tone signal via the antenna. The transmitter also has a decoupling element to protect the transmitter output from signals that the antenna receives in the case of excitation pulses of the magnetic resonance tomograph during magnetic resonance tomography. In the method, motion-dependent changes in the pilot tone signal of the transmitter are detected by a controller of the magnetic resonance tomograph.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the application of a pilot tone signal may be simplified.

A local coil of one or more of the present embodiments includes a transmitting antenna for emitting a pilot tone. The transmitting antenna may be, for example, a magnetic antenna in the form of a coil or loop, but an electric antenna like a dipole, may also be provided depending on the wavelength of the pilot tone signal. The pilot tone may be supplied by a magnetic resonance tomograph via a signal connection. In another embodiment, the local coil includes a transmitter for generating a pilot tone and a transmitting antenna for emitting the pilot tone. The transmitter may be, for example, an oscillator or different signal generators that may generate a signal with a predetermined frequency. An amplifier or a mixer may also be provided. The amplifier generates or derives the pilot tone signal from a signal supplied by the magnet resonance tomograph.

The local coil also includes a receiving antenna for receiving the pilot tone. The receiving antenna may be, for example, an antenna coil that is also provided for receiving MR signals in the local coil. In one embodiment, the pilot tone is in the same frequency range as the MR signal, or the receiving antenna is tuned to a plurality of frequencies (e.g., the frequency of the pilot tone and the frequency of the MR signal). In one embodiment, a separate receiving antenna is provided for the pilot tone signal. The local coil of one or more of the present embodiments includes a decoupling device for decoupling the receiving antenna from the transmitting antenna. Decoupling is regarded as a reduction in the pilot tone signal, received by the receiving antenna directly (e.g., without interaction with the environment, such as the patient; in the open space, by 3 dB, 6 dB, 12 dB or more compared to a local coil without a decoupling device). Different embodiments of a decoupling device are disclosed below.

The local coil of one or more of the present embodiments simplifies the application of the pilot tone by the integration of the transmitting antenna and the receiving antenna. The local coil with the decoupling device reduces components of the pilot tone signal that are received without interaction with the patient and thus, also do not contain any information on, for example, heartbeat or breathing. Without these direct signal components, the degree of modulation of the received pilot tone signal increases, and the signal-to-noise ratio as well as the detection of the physiological processes improve.

Further advantageous embodiments are disclosed below.

In one embodiment of the local coil, the decoupling device is configured to decouple the transmitting antenna inductively from the receiving antenna. For example, with a magnetic receiving and transmitting antenna, inductive decoupling, as disclosed below, may occur by geometric overlapping. However, in one embodiment, additional inductances or radio frequency transformers provide for decoupling.

In one embodiment, an inductive decoupling without galvanic contacts between pilot tone transmitter and receiving system may achieve a decoupling and thus avoid additional interference coupling and damping.

In one embodiment of the local coil, the receiving antenna includes a first antenna coil, and the decoupling device includes a first induction loop.

A magnetic antenna with an effect that is based on the induction of the magnetic component of an alternating electromagnetic field is referred to as an antenna coil. The electrical conductor of the antenna coil encloses a surface having an interior in which a magnetic field is induced by a current flowing through the conductor. The enclosed surface may be substantially flat. In other words, deviations of the enclosed surface perpendicular to a plane laid through the surface are less than 30%, 20%, or 10% of a maximum dimension of the enclosed surface parallel to the plane. The antenna coil may have one or more winding(s). Within the meaning of the present embodiments, an induction loop is also a plane surface at least partially enclosed by a conductor. In one embodiment, the induction loop is not completely closed (e.g., the conductor is not fed to or lead away from the induction loop in close proximity to each other). For example, the induction loop may therefore also be U-shaped. The conductor may also exhibit capacitive and/or inductive elements. In other words, in the general sense, the conductor may be a conductor with a complex impedance.

A projection of a surface enclosed by the first induction loop onto a surface enclosed by the first antenna coil along a surface normal of the enclosed surface has a non-empty intersection. For example, the surface normal of the previously described planes through the surfaces is regarded as a surface normal in this connection.

In other words, the antenna coil and the induction loop overlap, so a current flowing through the induction loop generates a magnetic field that passes through the antenna coil and induces a current there.

In one or more of the present embodiments, a targeted interaction may be achieved by an overlap of the surfaces of the induction loop and antenna coil, which may be adjusted over the surface of the overlap (e.g., the surface of the intersection). Depending on the current direction, the polarity of the magnetic field and therewith also the polarity of the induced current may be changed.

In one embodiment of the local coil, the decoupling device has a second induction loop that is substantially parallel to the first induction loop. Substantially parallel may be that the surface normals of the first induction loop and the second induction loop enclose an angle of less than 45 degrees, 30 degrees, or 10 degrees. In this case, the decoupling device is configured to generate a magnetic field in the first induction loop and the second induction loop, respectively, when the pilot tone is emitted. The magnetic field components of the pilot tone have the same sign in the direction of the surface normal of the surface enclosed by the first induction loop and/or second induction loop. In other words, the magnetic field generated by the first induction loop and the second induction loop is substantially aligned in the same direction. This may be achieved by the same current flowing through the first induction loop and the second induction loop in the same direction of circulation (e.g., both clockwise or both counterclockwise).

A projection of the surface enclosed by the second induction loop onto a surface enclosed by the first antenna coil along a surface normal of the enclosed surface has an empty intersection. This applies with respect to the surfaces and surface normal of the surfaces. In other words, the surface of the first antenna coil and the second induction loop do not overlap and are unconnected instead. As a result, the second induction loop is arranged with respect to the first antenna coil such that the surface enclosed by the first antenna coil lies outside the surface enclosed by the second induction loop. If, as previously stated, the magnetic field generated within the induction loops has the same sign, the magnetic field in the outer region of the induction loop has precisely the reversed sign. The effects of the induction loop and of the second induction loop on the first antenna coil are therefore reciprocally reduced. With suitable dimensioning of the first induction loop and the second induction loop and suitable positioning relative to the first antenna loop, it is even possible that the effect is cancelled.

A transmitting antenna including the first induction loop and the second induction loop is then decoupled from the receiving coil by the decoupling device.

In one embodiment of the local coil, the local coil has a second antenna coil. The intersection of a projection of the surface enclosed by the first induction loop onto a surface enclosed by the second antenna coil along a surface normal of the enclosed surface is an empty intersection. This applies in relation to the surfaces and surface normals. In other words, the first induction loop and the second antenna coil are unconnected and have no overlapping surfaces. A projection of the surface enclosed by the second induction loop onto a surface enclosed by the second antenna coil along a surface normal of the enclosed surface has a non-empty intersection. In other words, the second induction loop and the second antenna coil overlap, as do the first induction loop and the first antenna coil.

As already illustrated, the first induction loop, for the purpose of decoupling for the second induction loop from the second antenna coil, therefore acts in the same way as the second induction loop effects this for the first antenna coil. At the same time, however, the first induction loop and the second induction loop act as a transmitting antenna for the pilot tone signal owing to the rectified magnetic fields.

In one possible embodiment of the inventive local coil a projection of the surface enclosed by the first antenna coil along the surface normal onto the surface enclosed by the second antenna coil has a non-empty intersection. In other words, the first antenna coil and the second antenna coil overlap. In one embodiment, the overlapping surface takes up a proportion of less than 50%, 30%, 20%, or 10% of the surface enclosed by the first antenna coil or the second antenna coil.

The overlapping surface acts in the same way as that described for the induction loops, as an inductive decoupling between the first antenna coil and the second antenna coil.

In one embodiment of the local coil, the first induction loop has a bridging conductor. The bridging conductor electrically connects two points at the circumference of the first induction loop. In one embodiment, the transfer conductor has elements with a complex resistance (e.g., a capacitance). In this way, the bridging conductor divides the induction loop into two unconnected areas or regions. The two regions may have the same surface area, but the areas may differ in proportion (e.g., 40:60 or 30:70).

In one embodiment, the bridging conductor has a variable capacitance. The capacitance may, for example, be a trim capacitor with which identical transmit coils may be used and adapted in local coils with different geometries.

In one embodiment, capacitances that may be varied by the magnetic resonance tomograph by a voltage or a control signal (e.g., PIN diodes or also switchable capacitances with MEMS switches).

In one embodiment, the variable capacitance allows an effective surface, and therewith, an inductive coupling of the induction loop to the antenna coils, to be changed. In one embodiment, the decoupling of the transmitting antenna from the receiving antenna by the magnetic resonance tomograph may therefore be adjusted to different conditions (e.g., by the interaction with the body of the patient or a different geometry in the case of a flexible local coil), and maximum sensitivity is always achieved for the pilot tone signal coming from the body of the patient.

In one embodiment of the local coil, the decoupling device has a capacitive decoupling network with a capacitance that electrically connects the transmitting antenna to the receiving antenna. One or two capacitances, for example, that each electrically connect a tap of the transmitting antenna (e.g., on the first induction loop) with a tap at the receiving antenna (e.g., on the antenna coil) may be provided.

In one embodiment of the magnet resonance tomograph, the magnetic resonance tomograph has a local coil of one or more of the present embodiments. The magnetic resonance tomograph is configured to provide a pilot tone signal (e.g., in a radio frequency unit), transmit the pilot tone signal via a signal connection to the local coil, and emit the pilot tone signal via the transmitting antenna of the local coil.

In one embodiment, the magnetic resonance tomograph is able to provide signals with highly precise and stable frequencies, so the pilot tone signal may be prevented from disrupting image acquisition by magnetic resonance. For example, frequencies that are just outside a frequency range of the magnet resonance signal may be selected (e.g., by less than 100 kHz, 500 kHz, or 1 MHz), so the antennas for the MR signal are still sufficiently sensitive to receiving and may be used, but due to the exact adherence to the frequency spacing, a fault is avoided.

In one embodiment of the magnet resonance tomograph, the magnetic resonance tomograph has a local coil with a variable capacitance in the first induction loop. The magnetic resonance tomograph also has a control unit that is configured to adjust the variable capacitance such that the receiving antenna is optimally decoupled from the transmitting antenna. That the signal-to-noise ratio of the received pilot tone signal having an item of physiological information has a local maximum, for example, may be regarded as optimally decoupled. The control unit may reach this local maximum, for example, via a numerical gradient optimization method or another optimization method with variation of the variable capacitance.

DETAILED DESCRIPTION

Figure 1:
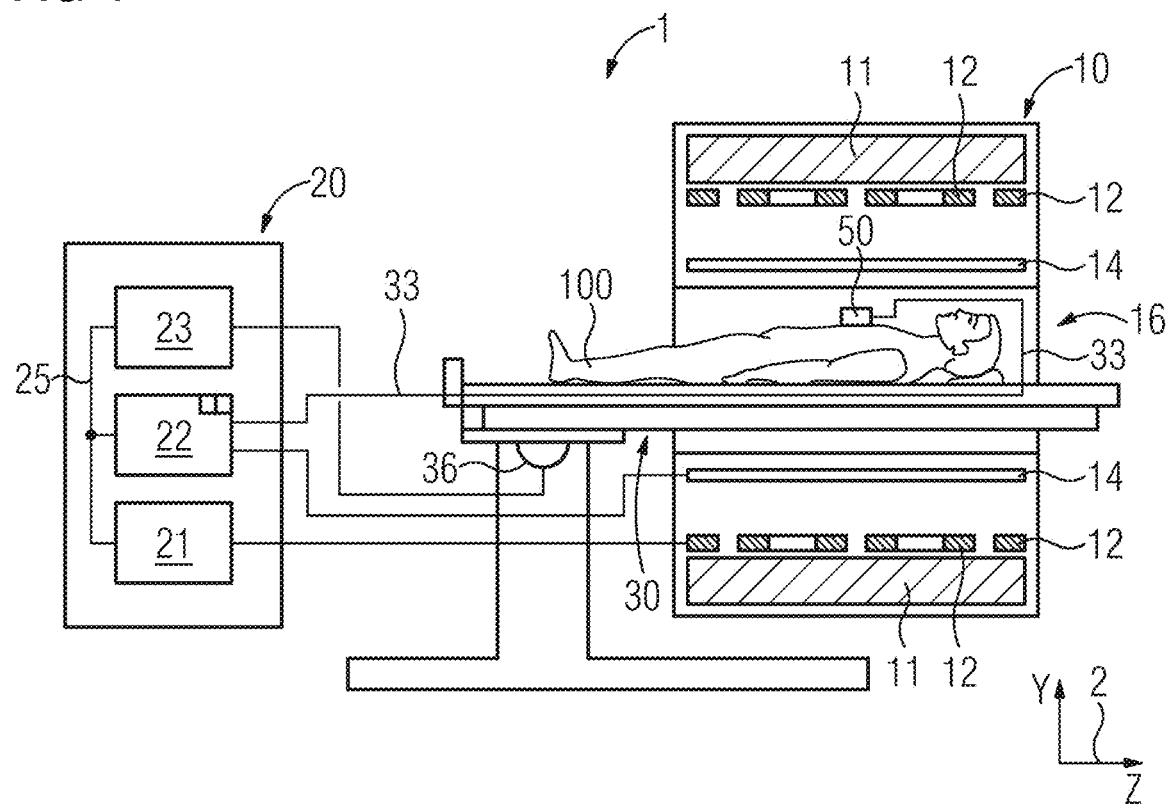
FIG. 1 shows a schematic representation of a magnetic resonance tomograph with one embodiment of a local coil.

FIG. 1 shows a schematic representation of an embodiment of a magnetic resonance tomograph 1 with a local coil 50 according to one embodiment.

The magnet unit 10 includes a field magnet 11 that generates a static magnetic field BO for orientation of nuclear spins of samples or a patient 100 in an acquisition region. The acquisition region is characterized by an extremely homogeneous static magnet field BO, Homogeneity relates, for example, to a magnetic field strength or an amount. The acquisition region is almost spherical and arranged in a patient tunnel 16 that extends in a longitudinal direction 2 through the magnetic unit 10. A patient couch 30 may be moved in the patient tunnel 16 by a traversing unit 36. The field magnet 11 is conventionally a superconducting magnet that may provide magnetic fields with a magnetic flux density of up to 3 T or more. For lower field strengths, however, permanent magnets or electrical magnets with normal conducting coils may also be used.

The magnet unit 10 includes gradient coils 12 that are configured to overlay variable magnetic fields in three spatial directions on the magnetic field BO in order to spatially differentiate detected imaging regions in an examination volume. The gradient coils 12 may be coils of normal conducting wires that may generate mutually orthogonal fields in the examination volume.

The magnet unit 10 also includes a body coil 14 that is configured to emit a radio frequency signal supplied via a signal line into the examination volume. The body coil 14 is further configured to receive resonance signals emitted by the patient 100 and deliver the resonance signals via a signal line.

A control unit 20 supplies the magnetic unit 10 with the various signals for the gradient coils 12 and the body coil 14 and evaluates the received signals.

Therefore, the control unit 20 has a gradient controller 21 that is configured to supply the gradient coils 12 via feed lines with variable currents that provide the desired gradient fields in the examination volume so as to be coordinated timewise.

The control unit 20 includes a radio frequency unit 22 that is configured to generate a radio frequency pulse with a predetermined time characteristic, amplitude, and spectral power distribution in order to excite a magnetic resonance of the nuclear spins in the patient 100. Pulse powers in the range of kilowatts may be achieved. The excitation pulses may be emitted via the body coil 14 or also via a local transmitting antenna into the patient 100.

A controller 23 communicates via a signal bus 25 with the gradient controller 21 and the radio frequency unit 22.

Arranged on the patient 100 is a local coil 50 that is connected via a connection line 33 to the radio frequency unit 22 and a receiver of the radio frequency unit 22.

Figure 2:
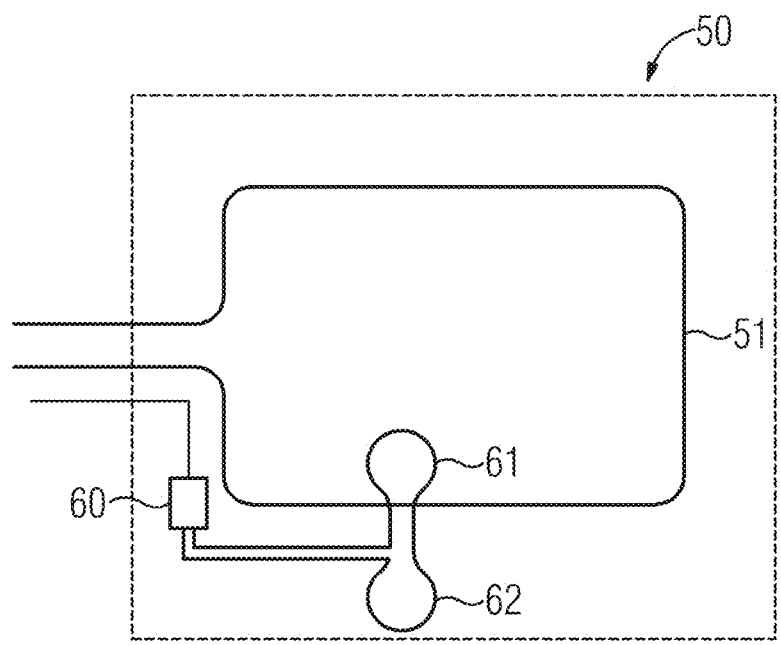
FIG. 2 shows a schematic representation of one embodiment of a local coil.

FIG. 2 shows an embodiment of a local coil 50. The local coil includes a first antenna coil 51 as a receiving antenna for MRI signals. A conductor loop with a single winding is shown by way of example, but antenna coils with a plurality of windings may also be provided. Additional capacitances in the antenna coil for tuning in the case of receiving or detuning during an excitation pulse may also be provided. For reasons of clarity, further elements for processing the received signals in the local coil, such as low-noise preamplifiers, oscillators, and mixers for frequency conversion or analog-to-digital converters for digitization are not shown.

In one embodiment, the local coil 50 still has a pilot tone transmitter 60 that generates a pilot tone signal. The pilot tone transmitter 60 is electrically connected to a transmitting antenna that has a first induction loop 61 and a second induction loop 62. The first induction loop 61 is located within a surface enclosed by the first antenna loop 51, while the second induction loop 62 is located outside this enclosed surface. In one embodiment, the first induction loop 61 is located in the direction of a surface normal of the enclosed surface (e.g., above or below the antenna loop). In one embodiment, the distance is smaller than a lateral dimension of the induction loop (e.g., the diameter of the induction loop).

In a further embodiment, the pilot tone signal is provided in the magnetic resonance tomograph 1 (e.g., in the radio frequency unit 22) and supplied to the local coil 50 via the connection line 33 of the local coil. Mixed forms may also be provided. For example, the magnetic resonance tomograph delivers a signal from which the pilot tone signal is generated by amplification, frequency conversion, and/or modulation. This provides, for example, a highly precise and stable frequency that does not interfere with the actual magnetic resonance image acquisition.

The first antenna coil 51, the first induction loop 61, and the second induction loop 62 are aligned substantially in parallel. In other words, one plane through the first antenna coil 51 and one plane through the first induction coil 61 or the second induction loop 62 enclose an angle smaller than 45 degrees, 30 degrees, or 10 degrees.

A current generated by the pilot tone transmitter 60 and fed to the transmitting antenna flows through the first induction loop 61 and the second induction loop 62 in the same direction of rotation, so that the current generates a magnetic field that is substantially parallel to each other or has a same direction in an inside of surfaces enclosed by the induction loops 61, 62. Outside the surfaces enclosed by the induction loops 61, 62, the magnetic field component changes a sign in the direction of the surface normals of the surfaces enclosed by the induction loops. For the first induction loop 61 in FIG. 2, some of the magnetic field lines that the first induction loop 61 generates also run outside the first antenna loop 51. The field generated by the first induction loop 61 inside the surface enclosed by the first induction loop 61 is only partly compensated by the field generated in the outer space of the first induction loop 61 with respect to a current induced in the first antenna loop 51. It is only by the second induction loop 62 and suitable dimensioning of the surfaces and lateral spacings that compensation may be achieved and the coupling between the transmitting antenna and the first antenna coil 51 may be reduced or eliminated altogether.

The pilot tone signal may be fed to the transmitting antenna or the induction loop directly via connections, as indicated in FIGS. 2 to 5, and may lead to a current flow in the induction loop. However, current flow in the induction loop may also be achieved by inductive coupling, as is often customary with magnetic antenna. Other adaptation networks with inductive and/or capacitive elements may also be provided. The same applies to the decoupling of a received pilot tone signal from the receiving antennas.

In principle, however, the first induction loop 61 and the second induction loop 62 may together form a coil with, for example, a winding and a continuous enclosed surface that is partly above the first antenna coil 51 and partly outside of the first antenna coil 51.

Figure 3:
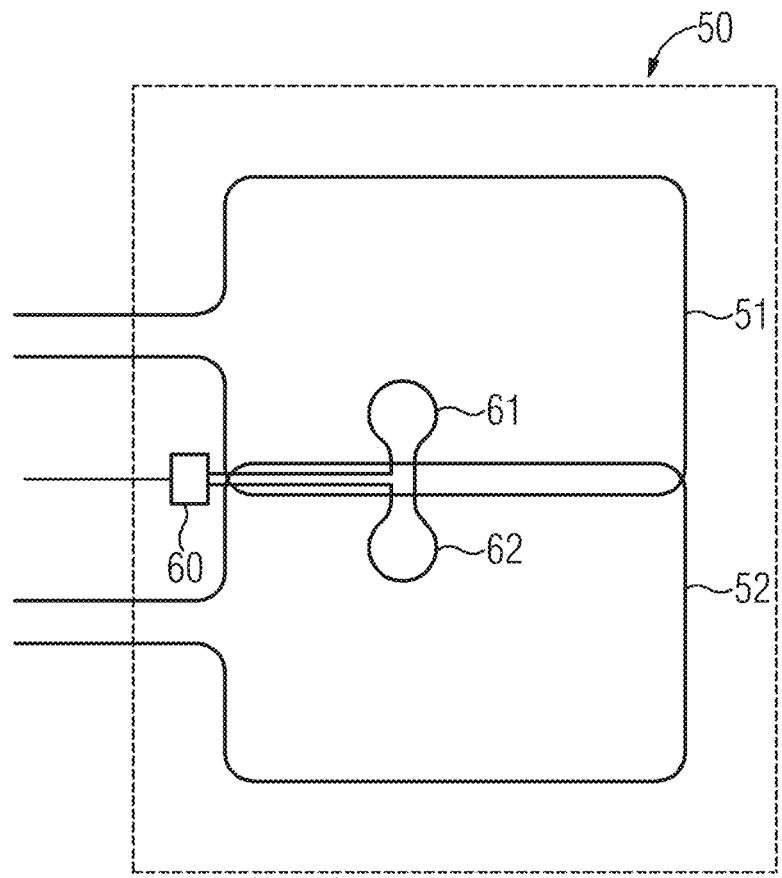
FIG. 3 shows a schematic representation of one embodiment of a local coil.

FIG. 3 shows an embodiment of the local coil with a first antenna coil 51 and a second antenna coil 52. The first antenna coil 51 and the second antenna coil 52 are arranged side by side to be able to acquire different areas of the patient 100 independently of each other, possibly even simultaneously. A signal of the neighboring coil is regarded as an interference signal in this case. Also, the magnetic fields reaching into the space of the other coil respectively also lead to interactions such as a detuning of the resonance frequency of the antenna coils. It is therefore desirable that the first antenna coil 51 and the second antenna coil 52 are decoupled from each other, in the sense that the interactions are reduced. As explained already in relation to FIG. 2 based on the first antenna coil 51 and the transmitting coil with the first induction loop 61 and the second induction loop 62, this may be achieved by enclosed surfaces overlapping. In FIG. 3, a surface that is enclosed by both antenna coils or in which the two antenna coils overlap is therefore provided between the first antenna coil 51 and the second antenna coil 52. With appropriate choice of overlapping surface areas to non-overlapping surface areas, complete decoupling of the first antenna coil 51 from the second antenna coil 52 may be achieved.

An arrangement of the first induction loop 61 or second induction loop 62 in this overlapping region of the two antenna coils 51, 52 reduces the degrees of freedom for decoupling the transmitting coil from the two antenna coils 51 and 52. These degrees of freedom may only be recovered by connecting the first induction loop 61 and the second induction loop 62 by way of conductors, which delimit as little effective surface as possible, for example, by having these connecting conductors closely guided in parallel or being twisted together. FIG. 3 indicates this by way of a "bone-shaped" outline of the first induction loop 61, the second induction loop 62, and the connecting conductor in between. By the effective surface of the connection of the first induction loop 61 and the second induction loop 62 approaching zero for induction through the first antenna coil and/or the second antenna coil, the length of the connection may be varied. Therewith, the spacing or position with respect to the first antenna coil 51 and the second antenna coil 52 is used to improve or optimize decoupling of the transmitting coil from the antenna coils 51, 52 at the same time as the mutual decoupling of the first antenna coil 51 and second antenna coil 52.

Figure 4:
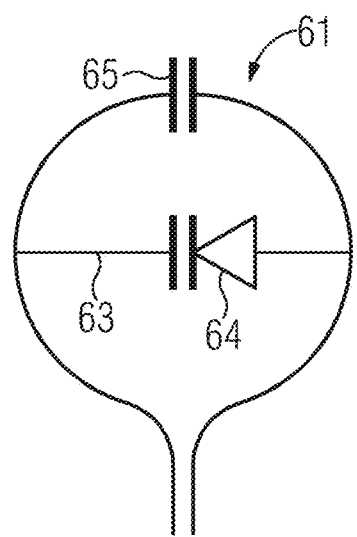
FIG. 4 shows a schematic representation of an induction loop of an embodiment of a local coil.

FIG. 4 shows a way of adjusting the effective surface of the first induction loop 61 and/or the second induction loop 62 without mechanical modification of the conductor loop. FIG. 4 shows the first induction loop 61 by way of example. In the embodiment shown, this is provided with a balancing capacitance 65 to balance the current distribution in the first induction loop 61 or the transmitting antenna including the first induction loop 61 and the second induction loop 62 between the regions divided by a bridging conductor 63 explained below. However, capacitances to adjust a resonance may also be provided.

The first induction loop 62 also has two taps or contact points along the loop conductor. The two taps or contact points along the loop conductor are electrically connected together by the bridging conductor 63. The bridging conductor 63 divides the surface enclosed by the first induction loop 62 into two unconnected sub-areas. For example, the area ratio of the sub-areas may be 50:50, but also 40:60 or smaller. The bridging conductor 63 may have one or more capacitances that are connected in series into the superstructure conductor. The capacitance may have a constant value and on mounting of the local coil 50, may adjust the transmitting antenna or the first induction loop 61 to different geometries, so the same conductor loop may be used for different induction loops in different local coils. A trim capacitor, which also allows an adjustment during installation, may also be provided.

In one embodiment, the capacitance is configured as variable capacitance 64, so the capacitance may be varied by the magnetic resonance tomograph 1 without mechanical access. A PIN diode may be provided as a variable capacitance 64, in which the pilot tone signal is overlaid with a DC voltage as a control voltage by the control unit 20 or the radio frequency unit 22. A controller in the local coil 50 that applies a voltage to the PIN diode in response to a signal of the control unit 20 of the magnetic resonance tomograph may also be provided. Capacitances that may be switched on by switches by controllers of the local coil may also be provided.

Since the magnetic resonance tomograph 1 is configured to adjust the effective surface of the first induction loop 61 and also of the second induction loop 62 (in an embodiment which is not shown) via the variable capacitance 64 in the bridging conductor 63, decoupling may also be automatically adapted to changed conditions (e.g., to other patients), and an optimum signal-to-noise ratio may be achieved for the pilot tone signal with the local coil of one or more of the present embodiments.

Figure 5:
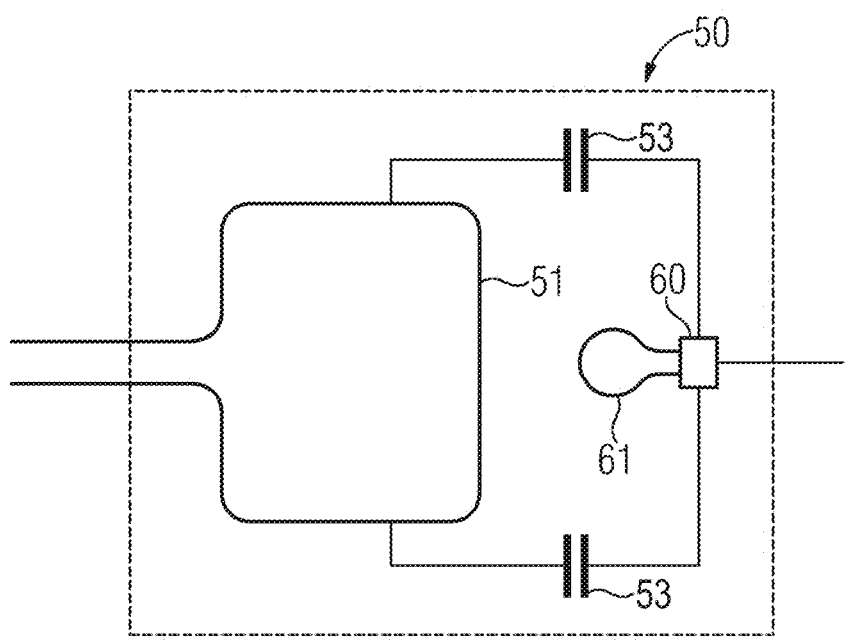
FIG. 5 shows a schematic representation of a capacitive decoupling network of one embodiment of a local coil.

FIG. 5 shows an embodiment of the local coil 50 in which the inductive decoupling of the first antenna coil 51 from the first induction loop 51 occurs via a capacitive decoupling by a decoupling network. In the simplest case, the decoupling network is provided by two decoupling capacitances 53 that connect the first antenna coil 51 at different taps to the first induction loop 61.

Although the invention has been illustrated and described in detail by the exemplary embodiments, the invention is not limited by the disclosed examples. A person skilled in the art may derive other variations herefrom without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomograph, the local coil comprising:
a transmitting antenna configured to emit a pilot tone;
a receiving antenna configured to receive the pilot tone; and
a decoupling device configured to decouple the receiving antenna from the transmitting antenna, wherein the decoupling device is configured to decouple the transmitting antenna inductively from the receiving antenna,
wherein the receiving antenna comprises a first antenna coil, and the decoupling device comprises a first induction loop, and
wherein a projection of a surface enclosed by the first induction loop onto a surface enclosed by the first antenna coil along a surface normal of the enclosed surface has a non-empty intersection.

2. The local coil of claim 1, wherein the decoupling device further comprises a second induction loop that is oriented substantially parallel to the first induction loop, wherein the decoupling device is further configured to generate a magnetic field in the first induction loop and the second induction loop, respectively, when the pilot tone is emitted,
wherein magnetic field components of the pilot tone have a same sign in a direction of the surface normal of the surface enclosed by the first induction loop, the second induction loop, or the first induction loop and the second induction loop, and
wherein a projection of the surface enclosed by the second induction loop onto a surface enclosed by the first antenna coil along a surface normal of the enclosed surface has an empty intersection.

3. The local coil of claim 2, further comprising a second antenna coil,
wherein a projection of the surface enclosed by the first induction loop onto a surface enclosed by the second antenna coil along a surface normal of the enclosed surface has an empty intersection, and
wherein a projection of the surface enclosed by the second induction loop onto a surface enclosed by the second antenna coil along a surface normal of the enclosed surface has a non-empty intersection.

4. The local coil of claim 3, wherein a projection of the surface enclosed by the first antenna coil along the surface normal onto the surface enclosed by the second antenna coil has a non-empty intersection.

5. The local coil of claim 1, wherein the first induction loop includes a bridging conductor that electrically connects two points of the first induction loop and divides the surface enclosed by the first induction loop into two unconnected areas.

6. The local coil of claim 5, wherein the bridging conductor has a variable capacitance.

7. The local coil of claim 1, wherein the decoupling device comprises a capacitive decoupling network with a decoupling capacitance that electrically connects the transmitting antenna to the receiving antenna.

8. A magnetic resonance tomograph comprising:
a local coil comprising:
a transmitting antenna operable to emit a pilot tone;
a receiving antenna operable to receive the pilot tone; and
a decoupling device configured to decouple the receiving antenna from the transmitting antenna,
wherein the magnetic resonance tomograph is configured to:
provide a pilot tone signal;
transmit the pilot tone signal to the local coil via a signal connection; and
emit the pilot tone signal via the transmitting antenna of the local coil,
wherein the decoupling device is configured to decouple the transmitting antenna inductively from the receiving antenna,
wherein the receiving antenna comprises a first antenna coil, and the decoupling device comprises a first induction loop, and
wherein a projection of a surface enclosed by the first induction loop onto a surface enclosed by the first antenna coil along a surface normal of the enclosed surface has a non-empty intersection.

9. The magnetic resonance tomograph of claim 8, wherein the first induction loop includes a bridging conductor that electrically connects two points of the first induction loop and divides the surface enclosed by the first induction loop into two unconnected areas, wherein the bridging conductor has a variable capacitance, and wherein the magnetic resonance tomograph further comprises a controller configured to adjust the variable capacitance such that the receiving antenna is optimally decoupled from the transmitting antenna.

10. The magnetic resonance tomograph of claim 8,
wherein the decoupling device further comprises a second induction loop that is oriented substantially parallel to the first induction loop,
wherein the decoupling device is further configured to generate a magnetic field in the first induction loop and the second induction loop, respectively, when the pilot tone is emitted,
wherein magnetic field components of the pilot tone have a same sign in a direction of the surface normal of the surface enclosed by the first induction loop, the second induction loop, or the first induction loop and the second induction loop, and
wherein a projection of the surface enclosed by the second induction loop onto a surface enclosed by the first antenna coil along a surface normal of the enclosed surface has an empty intersection.

11. The magnetic resonance tomograph of claim 10,
wherein the local coil further comprises a second antenna coil,
wherein a projection of the surface enclosed by the first induction loop onto a surface enclosed by the second antenna coil along a surface normal of the enclosed surface has an empty intersection, and
wherein a projection of the surface enclosed by the second induction loop onto a surface enclosed by the second antenna coil along a surface normal of the enclosed surface has a non-empty intersection.

12. The magnetic resonance tomograph of claim 11, wherein a projection of the surface enclosed by the first antenna coil along the surface normal onto the surface enclosed by the second antenna coil has a non-empty intersection.

13. The magnetic resonance tomograph of claim 10, wherein the first induction loop includes a bridging conductor that electrically connects two points of the first induction loop and divides the surface enclosed by the first induction loop into two unconnected areas.

14. A local coil for a magnetic resonance tomograph, the local coil comprising:
a transmitting antenna configured to emit a pilot tone;
a receiving antenna configured to receive the pilot tone; and
a decoupling device configured to decouple the receiving antenna from the transmitting antenna,
wherein the decoupling device comprises a capacitive decoupling network with a decoupling capacitance that electrically connects the transmitting antenna to the receiving antenna.

* * * * *